(12) United States Patent
Kang

(10) Patent No.: US 7,391,106 B2
(45) Date of Patent: Jun. 24, 2008

(54) STACK TYPE PACKAGE

(75) Inventor: Tae Min Kang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 91 days.

(21) Appl. No.: 11/449,990

(22) Filed: Jun. 9, 2006

(65) Prior Publication Data

US 2007/0007652 A1    Jan. 11, 2007

(30) Foreign Application Priority Data

Jul. 7, 2005    (KR) ...................... 10-2005-0061175

(51) Int. Cl.
*H01L 23/02* (2006.01)
(52) U.S. Cl. ................ 257/686; 257/738; 257/E23.085; 257/E25.006; 257/E23.021
(58) Field of Classification Search ................. 257/686, 257/738, E23.085, E25.006, E23.021
See application file for complete search history.

(56) References Cited

FOREIGN PATENT DOCUMENTS

| JP | 2000-216330 | 8/2000 |
|---|---|---|
| JP | 2001-210782 | 8/2001 |
| JP | 2003-7964 | 1/2003 |
| KR | 1992-0022518 | 12/1992 |
| KR | 20-1999-0030671 | 7/1999 |

OTHER PUBLICATIONS

Korean Patent Gazette from Korean Patent Office, publication date Jan. 16, 2007.

*Primary Examiner*—Andy Huynh
(74) *Attorney, Agent, or Firm*—Ladas & Parry LLP

(57) ABSTRACT

A stack type semiconductor package uses rigid, C-shaped guide substrates that hold semiconductor packages stacked in place and which also provide signal pathways between the stacked semiconductors and contact surfaces of the package. The C-shaped guide eliminate short circuits caused by prior art lead wires.

2 Claims, 3 Drawing Sheets

STACK TYPE PACKAGE

FIELD OF THE INVENTION

The present invention relates to a stack type semiconductor package. More particularly, the present invention relates to a stack type package providing simplified electric connection between chips and a substrate.

DESCRIPTION OF THE PRIOR ART

Generally, the dimensions and weight of finished semiconductor products are determined in part by the package. As electronic products have become increasingly miniaturized, space for mounting a semiconductor device in electric products has been further reduced. On the other hand, electronic products are becoming more and more enhanced with multiple functions and the current trend is to increase the kinds and the number of the semiconductor devices in order to support the multifunctional and high performance electronic products. In response to this trend, small, thin and light stack type packages have been developed for semiconductor devices in order to increase a mounting efficiency per unit volume.

FIG. 1 shows a prior art stack type package. As can be seen, multiple packages or devices or chips 12 are stacked one on top of the other. The chips 12 are held in place with respect to each other an adhesive 15 layer deposited on the upper surface of the substrate 11 and between each successive chip 12. As shown in FIG. 1, lead wires 13 extend between contact points of the chips 12 and the substrate 11 and are bonded in place in order to electrically connect the chips 12 to the substrate 11. The chips 12 and the wires 13 are then over-molded with a Epoxy Molding Compound (EMC) 14 in order to provide a protective cover or layer over the chips 12 and the wires 13. Solder balls 17 on the bottom or lower surface of the substrate 11 enable the stack type package 10 to be mounted on a printed circuit board (not shown). Reference number 16 identifies contact bumps on a chip 12 surface by which one chip 12 can be electrically connected to another chip however, the stack type package 10 constructed as described above requires enough wires 13 in order to electrically connect the chips 12 to the substrate 11. Unfortunately, as the number of the wires 13 increases, the likelihood of their tangling increases, increasing the likelihood of a short circuit, thereby causing the stack of devices to fail.

SUMMARY OF THE INVENTION

In light of the foregoing, an object of the present invention is to provide an improved stack type package which can, among other things, prevent or reduce short circuit malfunctions of chips that are stacked together in the package.

In order to accomplish these objects of the present invention, there is provided a stack type package which comprises: a substrate; a plurality of guide substrate pairs which are stacked one pair on another pair in such a manner that a pair of guide substrates are disposed at both sides of one surface of the substrate so as to be opposed to each other; a plurality of chips, each of which is disposed between the each pair of the guide substrates opposed to each other; and solder balls provided on the other surface of the substrate.

A guide substrate pair includes a pair of horizontal bars opposite each other and a vertical bar connecting the horizontal bars, which generally has the shape of the letter 'C' shape, and in which the horizontal bars have a contact pad formed on an opposing surface of each horizontal bar and the vertical bar has a via hole formed in the vertical bar.

Further, in one embodiment, the vertical bar has a electrically conductive layer formed on an inner surface to define the via hole.

The vertical bar with the via hole has a snap ring mounted on one side of the vertical bar, and a snap protrusion formed from the electrically conductive layer on the other side of the vertical bar.

Each chip has a chip pad making contact with the contact pad of the guide substrate.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION

Hereinafter, a preferred embodiment of the present invention will be described with reference to the accompanying drawings.

Figure 1:
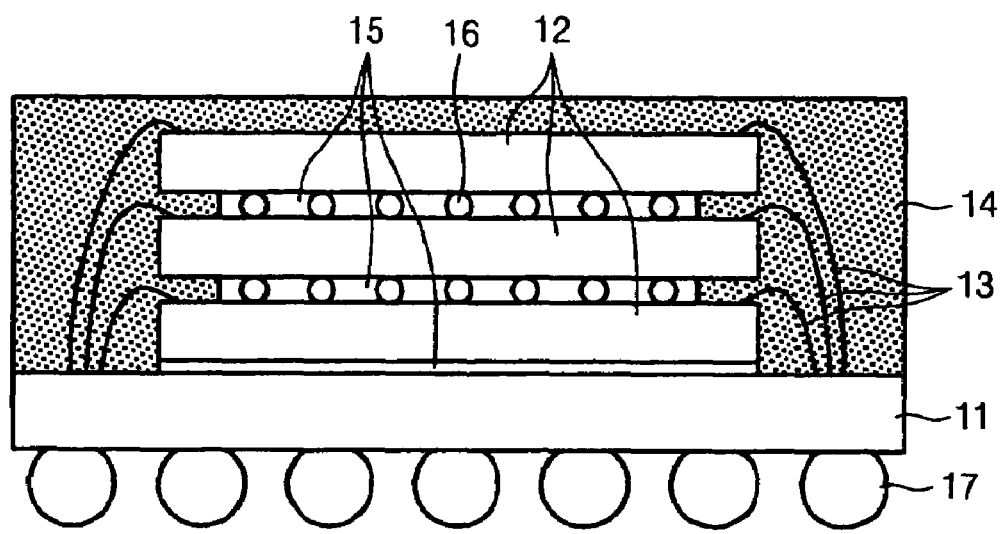
FIG. 1 is a sectional view showing a conventional stack type package.
Figure 2:
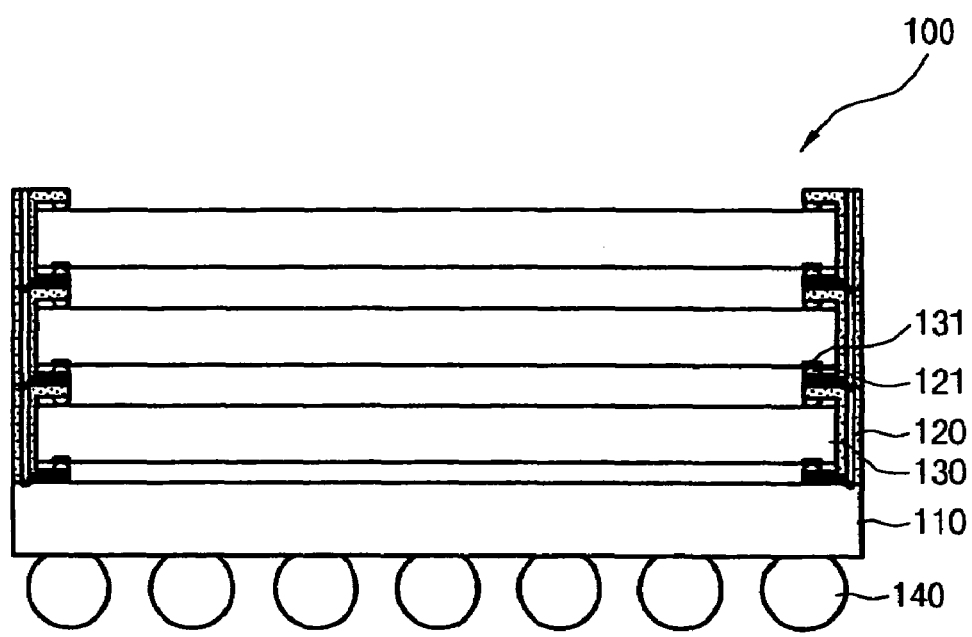
FIG. 2 is a sectional view showing a stack type package according to an embodiment of the present invention.
Figure 3:
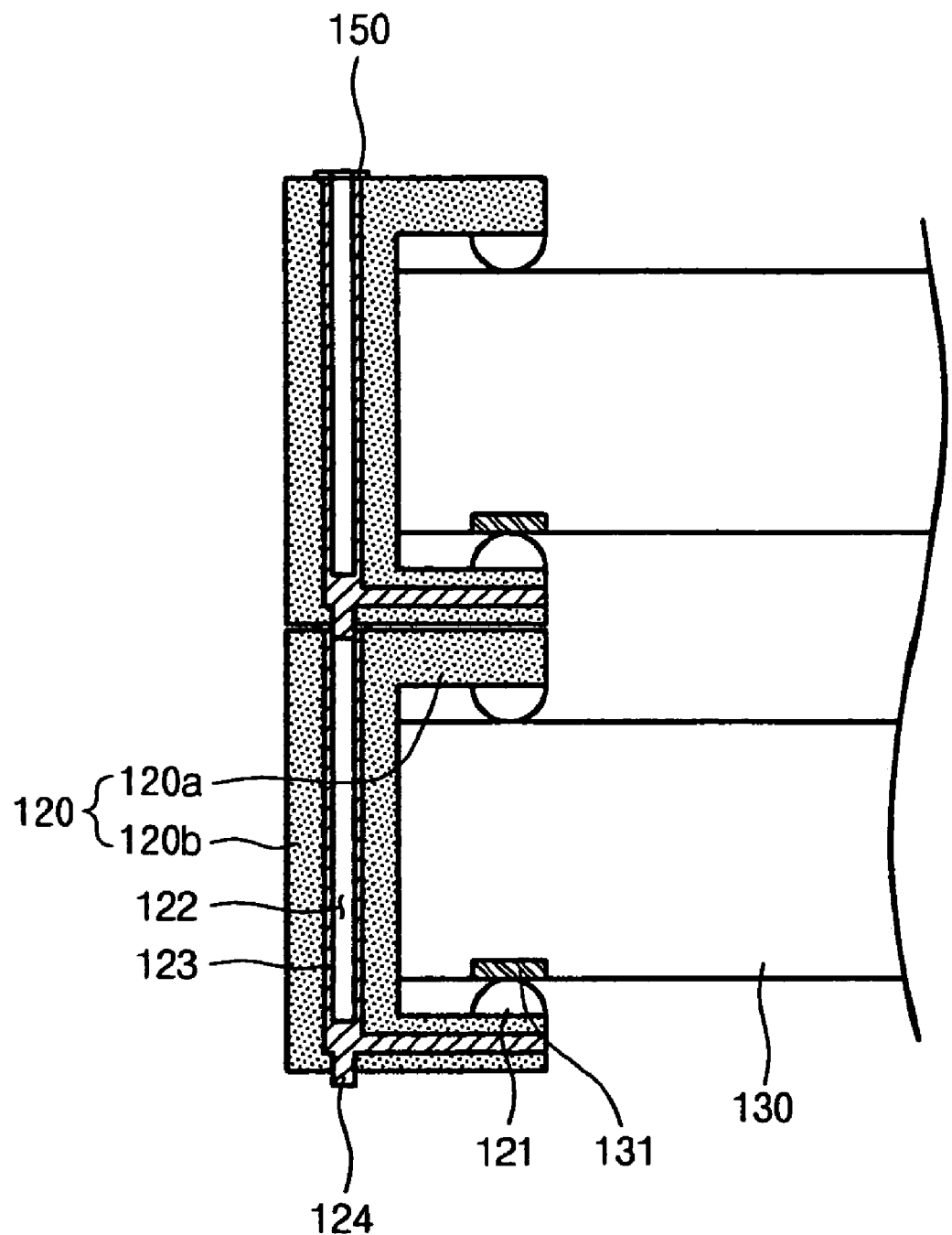
FIG. 3 is a partial sectional view showing the combination of a guide substrate and chips in the stack type package shown in FIG. 2.

FIG. 2 is a sectional view showing a stack type package according to an embodiment of the present invention, and FIG. 3 is a partial sectional view showing the combination of a guide substrate and chips in the stack type package shown in FIG. 2.

Herein, the epoxy molding compound (EMC) used for sealing and protecting the chips is well known in the art, so the description of the EMC will be omitted with relation to the drawings and the specification for clarity and brevity.

Referring to FIGS. 2 and 3, the stack type package 100 includes a substrate 110, a plurality of guide substrates 120, a plurality of chips 130, and solder balls 140.

The guide substrates 120 are in pairs, with one pair stacked on another pair in such a manner that each pair of the guide substrates 120 are disposed at both sides or ends of the surface of the substrate 110 so as to be opposed to or facing each other. A semiconductor chip 130 is disposed between each pair of the guide substrates 120. The guide substrates 120 are prepared in pairs and stacked in multi-layers. In this way, several chips 130 can be stacked on top of each other so long as they are disposed between a pair of the guide substrates 120 when they are stacked.

As can be seen in FIG. 3, each guide substrate 120 has a shape that resembles or is reminiscent of the letter 'C.' In the embodiment shown in FIG. 3, a pair of horizontal bars 120a are integrally formed with and extend orthogonally from a vertical bar 120b. The vertical bar 120b is sized and the horizontal bars 120a are connected to the vertical bar 120b so that the vertical spacing between or separation of the horizontal bars 120a allows a chip 130 to be inserted into the space between the horizontal bars 120a. The length of the vertical bar 120b and the length of the horizontal bars 120a give the guide substrate 120 a shape that resembles or is suggestive of the shape of the letter 'C'.

One or both of the horizontal bars 120a are provided with one or more contact pads 121. As shown in FIG. 3, the contact pads, which are shown in the figure to be proximate to the distal ends of the horizontal bars 120a, have a substantially hemispheric shape. Alternate embodiments have contact pads with other shapes. The contact pad 121 fixes the chip 130 inserted into the C-shape guide substrate 120 and makes an electrical contact with a corresponding chip pad or surface 131 that is provided on a lower surface of the chip 130, but which could also be provided on the upper surface or both surfaces of the chip 130.

The vertical bar 120b has a via hole or tube 122 formed therein, of which the inner surface defining the via hole 122 has an electrically conductive electrically conductive layer 123 formed thereon. The electrically conductive layer 123 in the via hole 122 provides an electrical connection between the chips 130 stacked on one another.

As can be seen in the figure, a snap ring 150 is mounted on one end of the vertical bar 120b having an opening of the via hole 122, and the copper layer 123 extends out of the other end of the vertical bar 120b so as to form a snap protrusion 124. The snap ring 150 and the snap protrusion 124 are used for the combination of the guide substrates 120 when the plurality of guide substrates 120 are stacked on one another, which are coupled to one another in such a manner that the snap protrusion 124 is fixedly inserted into the snap ring 150.

Each chip 130 is inserted between opposing guide substrates 120 and combined with other guide substrates 120. Each of the opposing guide substrates 120, which has the chip pad 131 on the surface thereof making contact with the contact pad 121 of the guide substrate 120 so that the chip pad electrically connects the chip 130 to the guide substrate 120.

In the stack type package having the above-mentioned structure, the chips 130 are fixed to the guide substrates 120, and electrical connections between the substrate and the chips 130 is accomplished by using the contact pads 121 which are provided on the guide substrates 120, instead of wires used in the conventional method of manufacturing a stacked package. Using the structure shown in FIGS. 2 and 3 it is possible to avoid short circuits due to tangling of wires used in prior art stacked packages which will prevent malfunction of the chips and/or package.

In the stack type package according to the present invention as described above, the guide substrates are used for stacking the chips thereon and the contact pads are also provided on the guide substrates in order to carry out electric connection between the chips and the guide substrates, thereby preventing the short circuit caused by electric connecting media between the chips and the substrates, preventing the malfunction of the package, and improving the reliability of the package.

While a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A stack type package comprising:
   a substrate;
   a plurality of guide substrate pairs which are stacked one pair on another pair in such a manner that each pair of guide substrates are disposed at opposing sides of one surface of the substrate so as to be opposed to each other, each guide substrate including a pair of horizontal bars attached to and extending from a vertical bar, the length and extension of the horizontal bars from the vertical bar giving the guide substrate a shape in the form of the letter 'C', at least one of the horizontal bars having a contact pad formed on a first surface of the horizontal bar, said vertical bar having a via hole formed in the vertical bar and wherein the vertical bar has an electrically conductive layer formed on an inner surface of the via hole and wherein the vertical bar with the via hole has a snap ring mounted on one side of the vertical bar, and a snap protrusion formed from the electrically conductive layer on the other side of the vertical bar;
   a plurality of chips, each of which is disposed between a pair of the guide substrates; and
   solder balls provided on the other surface of the substrate.

2. The stack type package as claimed in claim 1, wherein each chip has a chip pad making contact with the contact pad of the guide substrate.

* * * * *